United States Patent
Jin

(10) Patent No.: US 7,244,666 B2
(45) Date of Patent: Jul. 17, 2007

(54) MULTI-GATE TRANSISTOR FORMED WITH ACTIVE PATTERNS OF UNIFORM CRITICAL DIMENSION

(75) Inventor: You-Seung Jin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 11/046,956

(22) Filed: Jan. 31, 2005

(65) Prior Publication Data

US 2005/0173740 A1    Aug. 11, 2005

(30) Foreign Application Priority Data

Feb. 7, 2004    (KR)    ............... 10-2004-0008148

(51) Int. Cl.
*H01L 21/20*    (2006.01)
(52) U.S. Cl. ............... 438/481; 438/157; 257/74
(58) Field of Classification Search ............... 438/481; 257/74; 738/157
See application file for complete search history.

(56) References Cited

U.S. PATENT DOCUMENTS

| | | | |
|---|---|---|---|
| 5,793,058 A | 8/1998 | Han et al. ............... 257/66 |
| 6,351,841 B1 | 2/2002 | Tickle ............... 716/8 |
| 6,413,802 B1 * | 7/2002 | Hu et al. ............... 438/151 |
| 6,433,372 B1 | 8/2002 | Adler et al. ............... 257/288 |
| 6,800,910 B2 * | 10/2004 | Lin et al. ............... 257/410 |
| 2004/0145019 A1 * | 7/2004 | Dakshina-Murthy et al. .... 257/349 |
| 2004/0266077 A1 * | 12/2004 | Yeo et al. ............... 438/157 |

OTHER PUBLICATIONS

Korean Patent Application No. 10-1991-0004011 having Publication date of Oct. 22, 1992 (w/ English Abstract page).
*A Spacer Patterning Technology for Nanoscale CMOS* to Choi et al., IEEE Transactions on Electronic Devices, vol. 49, No. 3, Mar. 2002.
*A High Performance Fully-Depleted Tri-Gate CMOS Transistors* to Doyle et al., IEEE Electron Device Letters, vol. 24, No. 4, Apr. 2003.

* cited by examiner

*Primary Examiner*—Jerome Jackson
*Assistant Examiner*—Mohammad Timor Karimy
(74) *Attorney, Agent, or Firm*—Monica H. Choi

(57) ABSTRACT

For fabricating a multi-gate transistor, at least one active pattern having uniform critical dimension is formed. Epitaxy structures are grown from exposed portions of the active pattern. A channel region of the transistor is formed from at least two surfaces of the active pattern. Source and drain are formed using the epitaxy structures.

16 Claims, 13 Drawing Sheets

MULTI-GATE TRANSISTOR FORMED WITH ACTIVE PATTERNS OF UNIFORM CRITICAL DIMENSION

BACKGROUND OF THE INVENTION

This application claims priority to Korean Patent Application No. 2004-0008148 filed on Feb. 7, 2004 with the Korean Intellectual Property Office, the disclosure of which is incorporated herein in its entirety by reference.

1. Field of the Invention

The present invention relates generally to fabrication of integrated circuits, and more particularly to fabricating a multi-gate transistor with at least one active pattern formed with uniform critical dimension for improved performance.

2. Description of the Related Art

Multi-gate transistors with a double-gate structure or a tri-gate structure have been developed for overcoming performance degradation from reduction of gate length (Kunihiro Suzuki et al., IEEE 1993 "Scaling Theory for Double-Gate SOI MOSFETs"; Robert Chau, SSDM 2002, "Advanced Depleted-Substrate Transistors: Single-Gate, Double-Gate and Tri-Gate"; Z. Krivokapic, SSDM 2003, "High Performance 45 nm CMOS Technology with 20 nm Multi-Gate Devices"; Jeong-Hwan Yang, IEDM 2003, "Fully Working 6T-SRAM Cell with 45 nm Gate Length Triple Gate Transistors").

A conventional single-gate planar transistor requires a fully depleted region having a thickness (Tsi) less than ⅓ of a gate length (Lg). Accordingly, when the gate length is reduced, an ultra-thin silicon body is needed. In contrast, an active structure of a multi-gate transistor has higher tolerance for the thickness (Tsi) of the fully depleted region.

Referring to FIG. 1, an active structure of a multi-gate transistor is formed using a mask 10 with active region patterns 12 that include optical proximity correction. FIG. 2 illustrates a photoresist pattern 20 patterned using the mask 10 of FIG. 1. Referring to FIG. 2, a profile of a bar pattern 22 defining a region where a channel region is to be formed is not straight but is curved due to limitations of the optical proximity correction during photolithography. Thus, a hole profile appears between bar patterns 22.

With such hole profiles, critical dimensions (CD) of the bar patterns 22 are not uniform. Referring to FIGS. 2 and 3, a gate electrode 34 is desired to be formed across the bar patterns 22. However, because of processing misalignment, the gate electrode 34 may be formed at misaligned positions 36 and 38 that are offset from the middle of the bar patterns 22. Such misalignment of the gate electrode 34 positioned over curved portions of the bar patterns 22 disadvantageously results in performance degradation of the transistor.

In addition, referring to FIG. 4, with such hole profiles 32, silicon 42 may remain from not being etched away especially when such hole profiles 32 have high aspect ratio. Furthermore, the openings of the hole profiles 32 may not be uniform in size with some openings being formed too small or not being formed at all.

Accordingly, a multi-gate transistor is desired to be formed with active patterns having more uniform critical dimension.

SUMMARY OF THE INVENTION

For fabricating a multi-gate transistor, at least one active pattern having uniform critical dimension is first formed. Thereafter, at least one epitaxy structure is grown from an exposed portion of the active pattern. In addition, a channel region of the transistor is formed from at least two surfaces of the active pattern.

In another embodiment of the present invention, two epitaxy structures are formed, each from a respective end of the active pattern that is a line pattern. In that case, each of a drain and a source of the transistor is formed with a respective one of the epitaxy structures.

In a further embodiment of the present invention, a plurality of active patterns are formed with each being a line pattern having a mesa shape. In addition, a respective epitaxy structure is formed from each end of the active patterns. In an example embodiment of the present invention, at least two of the epitaxy structures contact each-other. In that case, a drain of the transistor is formed from a first set of epitaxy structures that contact each other, and a source of the transistor is formed from a second set of epitaxy structures that contact each other.

Further with the plurality of active patterns, the channel region is formed from surfaces of at least two of the active patterns. For example, such a channel region results from a gate insulator and a gate electrode formed along center portions of the active patterns.

In yet another embodiment of the present invention, an insulating cap is formed on top of each active pattern before forming the gate insulator and the gate electrode for forming the channel region at two surfaces of each active pattern.

In a further embodiment of the present invention, a semiconductor layer is formed on an insulating layer, and the semiconductor layer is patterned to form the active pattern.

In another embodiment, an epitaxial mask is formed on a portion of the active pattern on which the channel region is to be formed before growing the epitaxy structure from each exposed portion of the active pattern.

In this manner, active patterns having uniform critical dimension are initially formed before growing the epitaxy structures at the ends of the active patterns. Thus, the multi-gate transistor having channel regions formed with such active patterns has enhanced performance.

BRIEF DESCRIPTION OF THE DRAWINGS

The above and other features and advantages of the present invention will become more apparent when described in detailed exemplary embodiments thereof in reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20A, 20B, 20C, 21, 22, 23, and 24 refer to elements having similar structure and/or function.

DETAILED DESCRIPTION OF THE INVENTION

Figure 1:
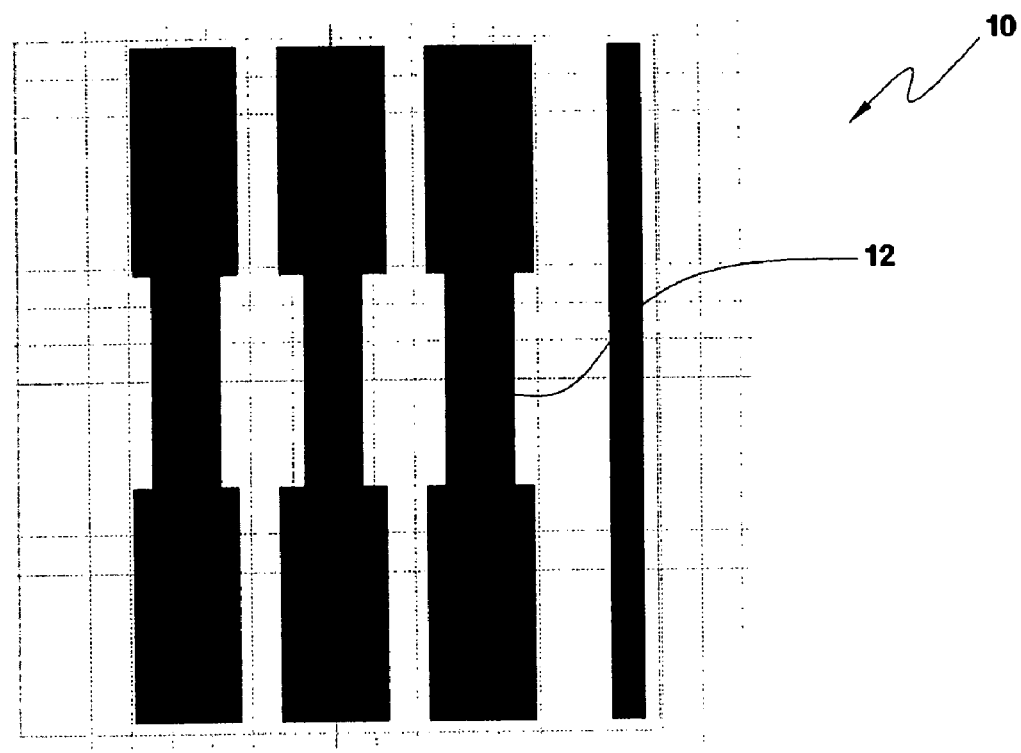
FIG. 1 shows a conventional mask pattern defining an active region for a conventional multi-gate transistor.
Figure 2:
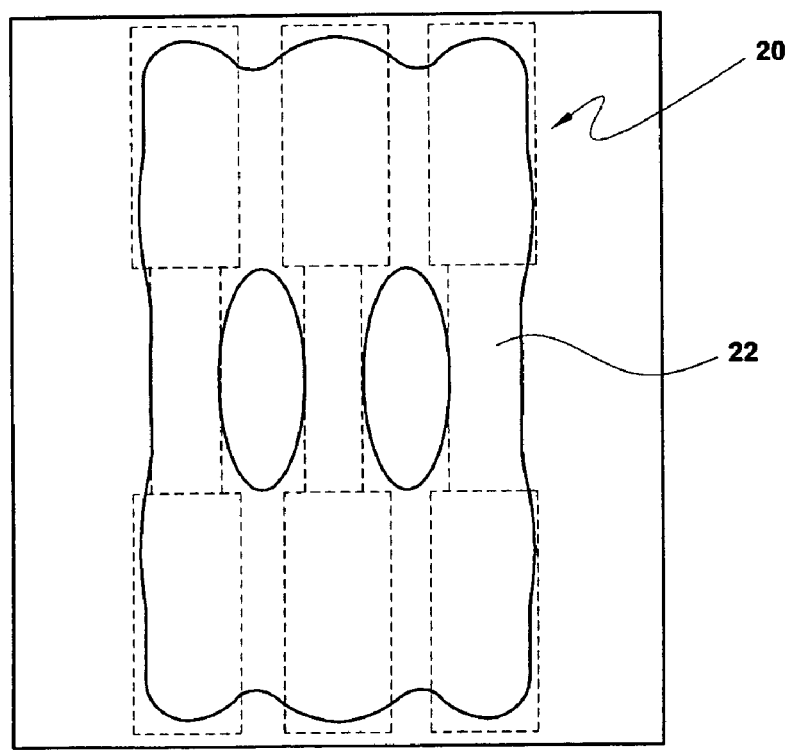
FIG. 2 shows a photoresist pattern defined by the mask pattern of FIG. 1, according to the prior art.
Figure 3:
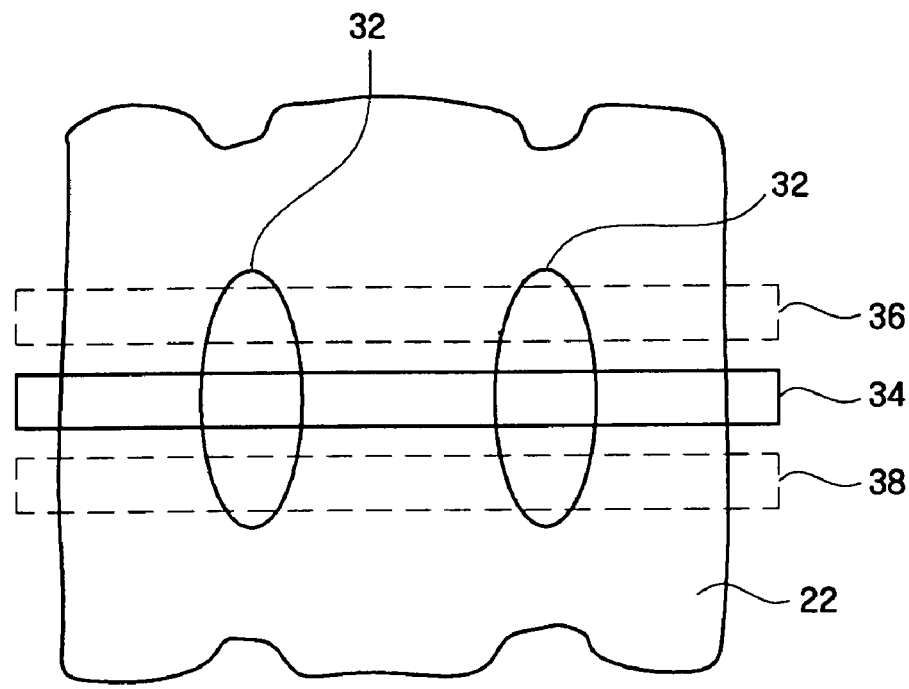
FIG. 3 shows the active region resulting from the photoresist pattern of FIG. 2 with possible misalignment of a gate electrode, according to the prior art.
Figure 4:
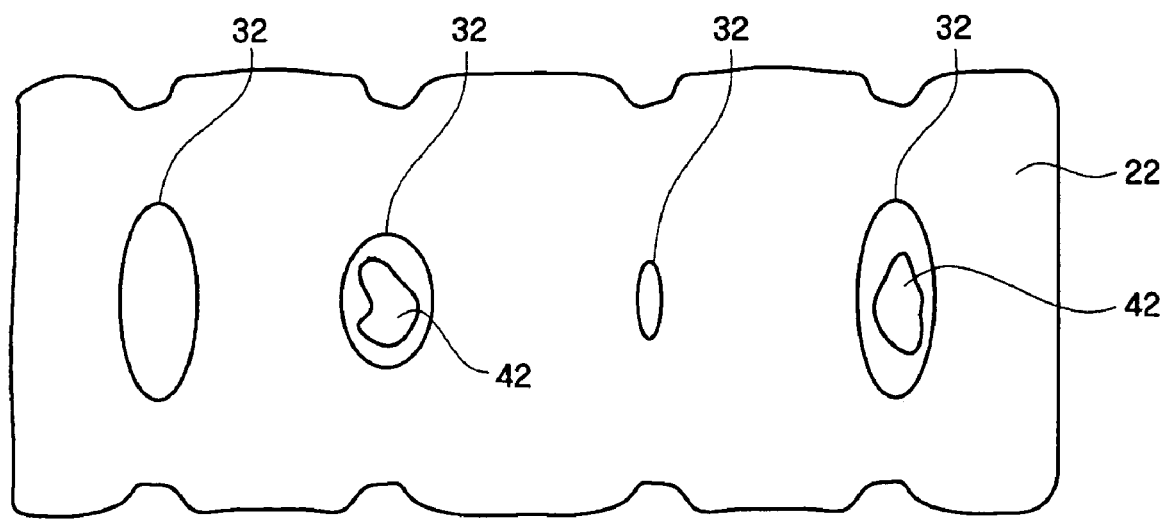
FIG. 4 shows hole profiles formed with non-uniform shape and size and with non-etching of semiconductor, according to the prior art.
Figure 5:
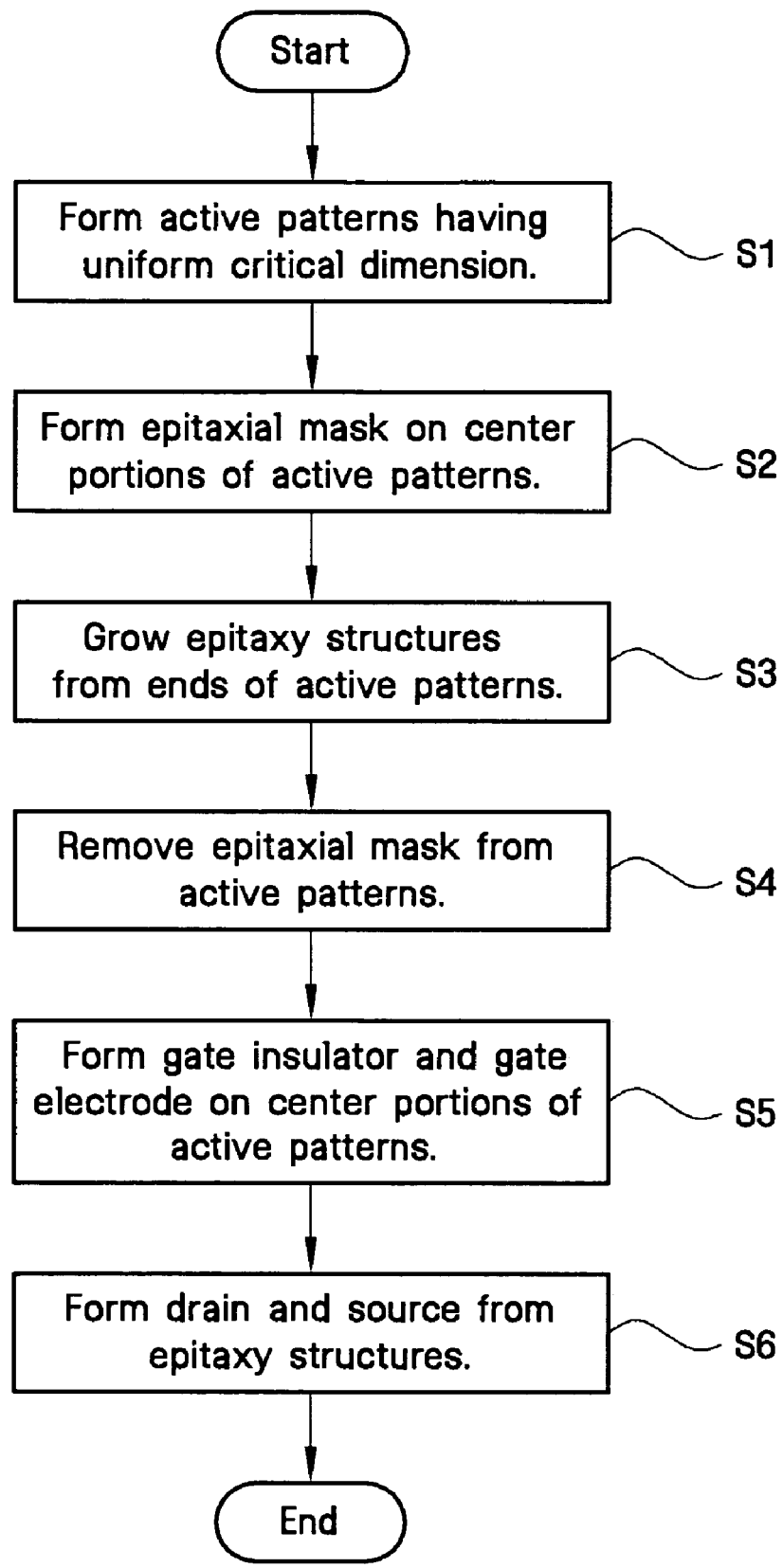
FIG. 5 is a flowchart of steps for fabricating a multi-gate transistor according to an embodiment of the present invention.
Figure 6:
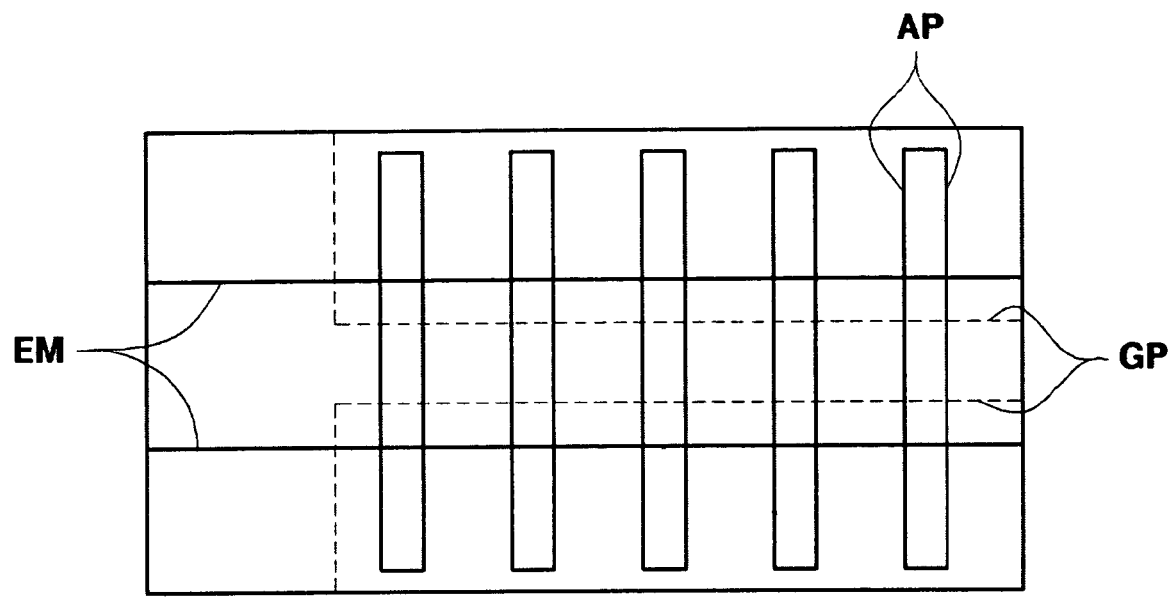
FIG. 6 shows a layout of structures for fabricating a multi-gate transistor, according to an embodiment of the present invention.

FIG. 5 shows a flowchart of steps for fabricating a multi-gate transistor according to an embodiment of the present invention. FIG. 6 illustrates a layout for fabricating structures of the multi-gate transistor according to an embodiment of the present invention. FIGS. 7, 8, 9, 10, 11, 12, 13, 14, 15, 16, and 17 show perspective views of structures formed for fabricating the multi-gate transistor according to an embodiment of the present invention.

In the layout of FIG. 6, AP denotes an active pattern on which a channel region of the multi-gate transistor is to be formed. In addition, EM denotes an epitaxial mask pattern defining a region where epitaxy structures are to be formed. Furthermore, GP denotes a gate pattern wherein a gate electrode is to be formed. The epitaxial mask pattern EM is larger than the gate pattern GP for tolerance of misalignment of the gate electrode.

Figure 7:
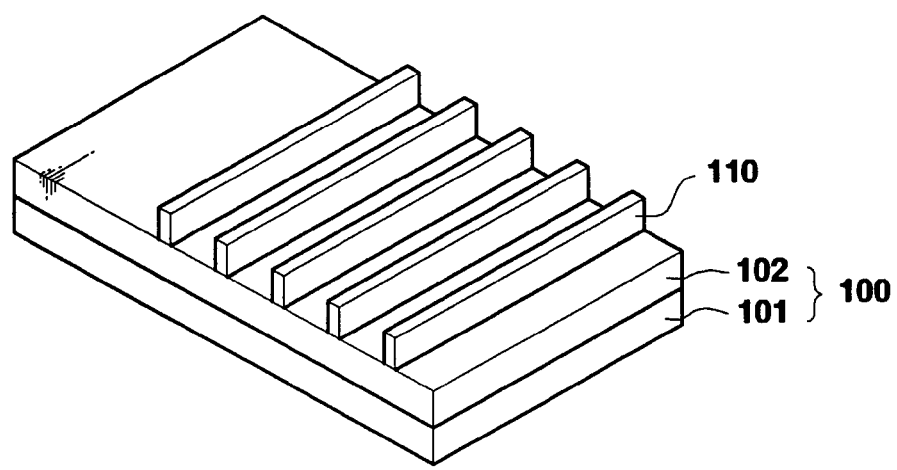
FIGS. 7, 8, 9, 10, 11, 12, 13, 14, 15, 16, and 17 show perspective views of structures formed during fabrication of the multi-gate transistor, according to an embodiment of the present invention.

Referring to FIG. 7, a semiconductor layer 102 is formed on an insulating layer 101 such as in typical SOI (silicon-on-insulator) technologies for example. Such SOI technology reduces drain induced barrier lowering (DIBL) in the multi-gate transistor to be formed, and such SOI technology may include a bonding process or a Separation by IMplantation of OXygen (SIMOX) process. The semiconductor layer 102 may be comprised of silicon or silicon and germanium for example. Instead of the semiconductor layer 102, a bulk silicon substrate or a silicon germanium substrate may also be used for the present invention.

Figure 8:
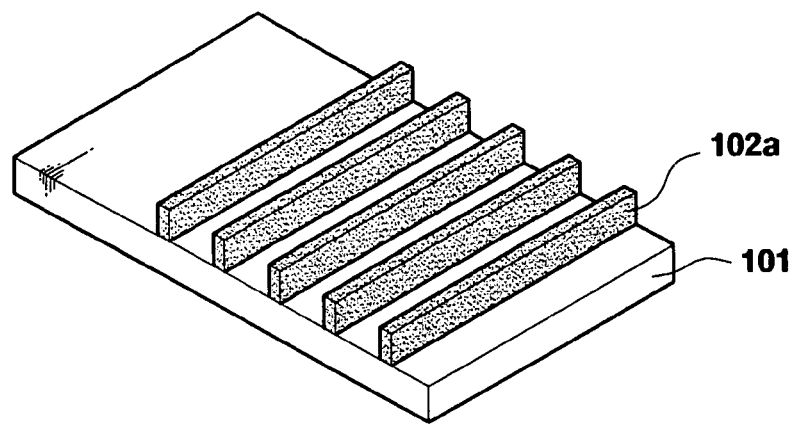

Thereafter in FIG. 7, a photoresist pattern 110 is formed on the semiconductor layer 102 by patterning a photoresist layer from the active pattern AP of FIG. 6. Referring to FIGS. 7 and 8, exposed portions of the semiconductor layer 102 are etched away using the photoresist pattern 110 as an etch mask to form a plurality of active patterns 102a (step S1 of FIG. 5).

Each active pattern 102a is a line pattern having a mesa shape (rectangular box shape) with two sidewalls and a top surface of the active pattern 102 being exposed in the embodiment of FIG. 8. A bottom surface of each active pattern 102a contacts the insulating layer 101. In addition, each active pattern 102a formed as the line pattern has a straight profile with substantially uniform critical dimension. Moreover with such line patterns 102a, a hole profile does not form at the space between adjacent active patterns 102a. For enhanced speed performance of the multi-gate transistor, the active patterns 102a are formed in a line-and-space pattern with a pitch between adjacent active patterns 102a being less than about 300 nm.

Figure 9:
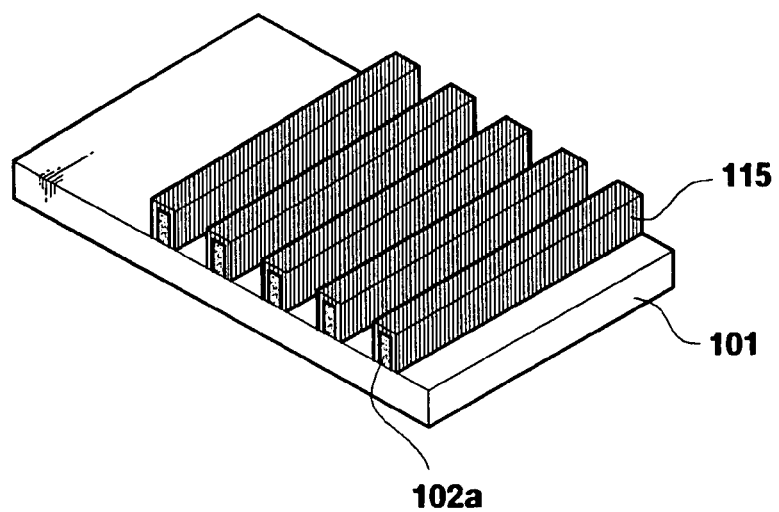

Referring to FIGS. 8 and 9, an etch stopper 115 is formed on exposed surfaces of the active patterns 102a by oxidizing the active patterns 102a or by depositing an oxide layer on the active patterns 102a. The etch stopper 115 has a thickness of several hundred angstroms, such as 100-300 Å for example.

Figure 10:
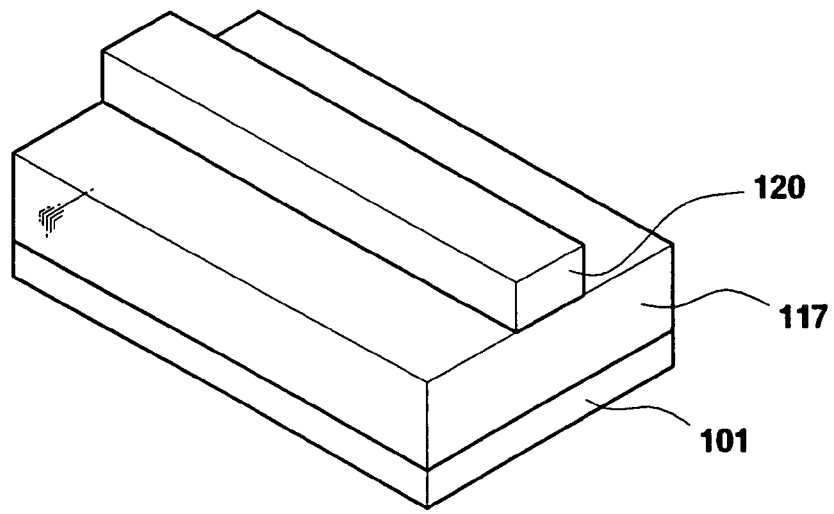

Referring to FIG. 10, an epitaxial mask layer 117 is blanket deposited after formation of the etch stopper 115 in FIG. 9. The etch stopper 115 mitigates stress between the upper epitaxial mask layer 117 and the active patterns 102a. Thereafter, a photoresist pattern 120 is formed from the epitaxial mask pattern EM of FIG. 6. The epitaxial mask layer 117 is comprised of a material having high etch selectivity from the etch stopper 115. For example, the epitaxial mask layer 117 is comprised of SiN (silicon nitride) or SiON (silicon oxy-nitride) having a thickness of several tens to hundreds of angstroms using chemical vapor deposition (CVD).

Figure 11:
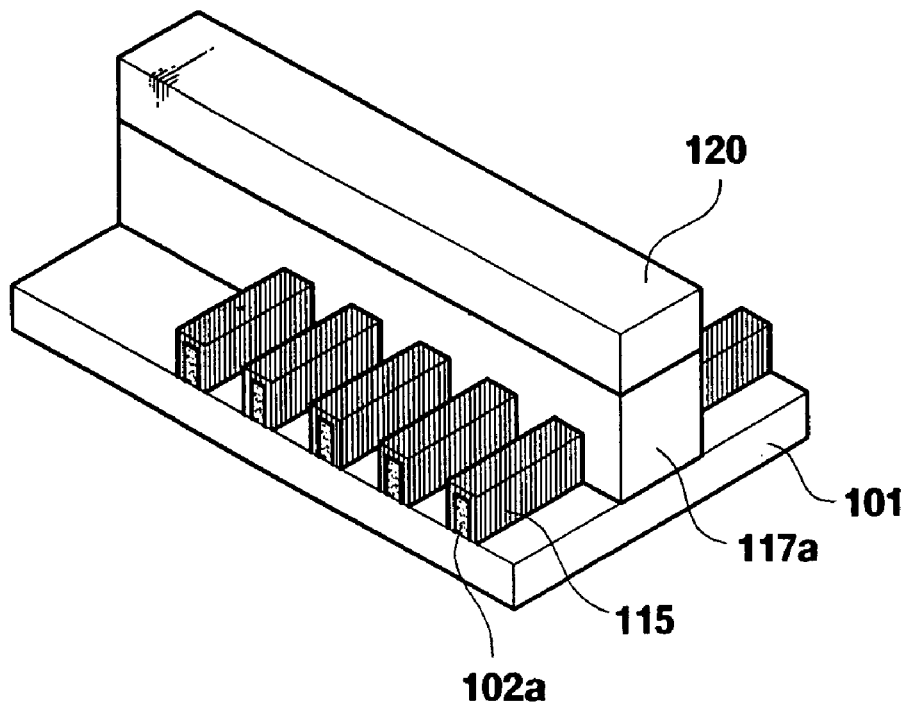

Referring to FIGS. 10 and 11, exposed portions of the epitaxial mask layer 117 are etched away using the photoresist pattern 120 as an etch mask in a typical dry etching process for example. During such an etching process, the etch stopper 115 prevents the active patterns 102a from being etched or damaged. If exact time control is possible for etching the epitaxial mask layer 117, the etch stopper 115 may be eliminated. After the etching process, an epitaxial mask 117a remains under the photoresist pattern 120 along a center portion of the active patterns 102a (step S2 of FIG. 5).

Figure 12:
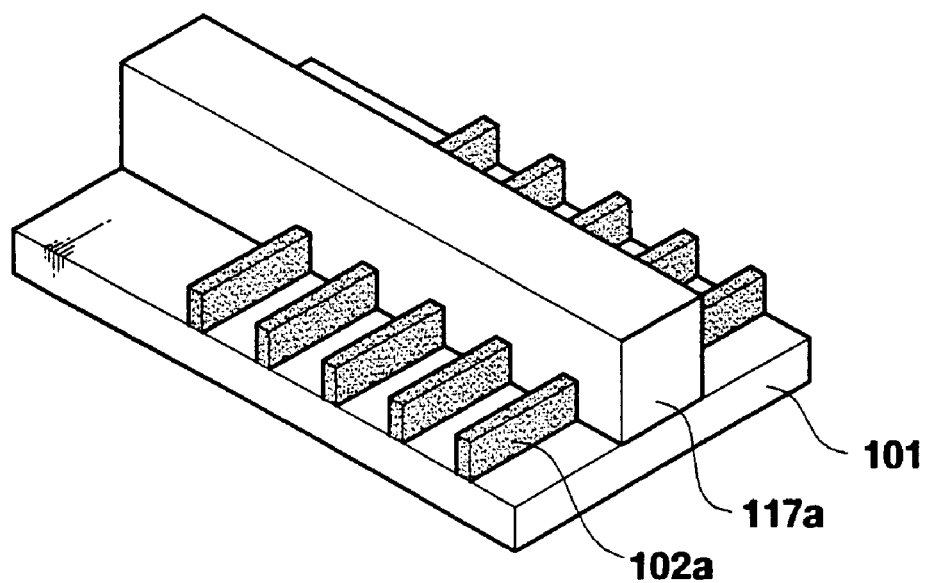

Referring to FIG. 12, the photoresist pattern 120 is removed using an ashing process and a strip process. Subsequently, cleaning is performed during which the etch stopper 115 is removed to expose ends of the active patterns 102a. Alternatively, the etch stopper 115 may be removed before the cleaning.

Figure 13:
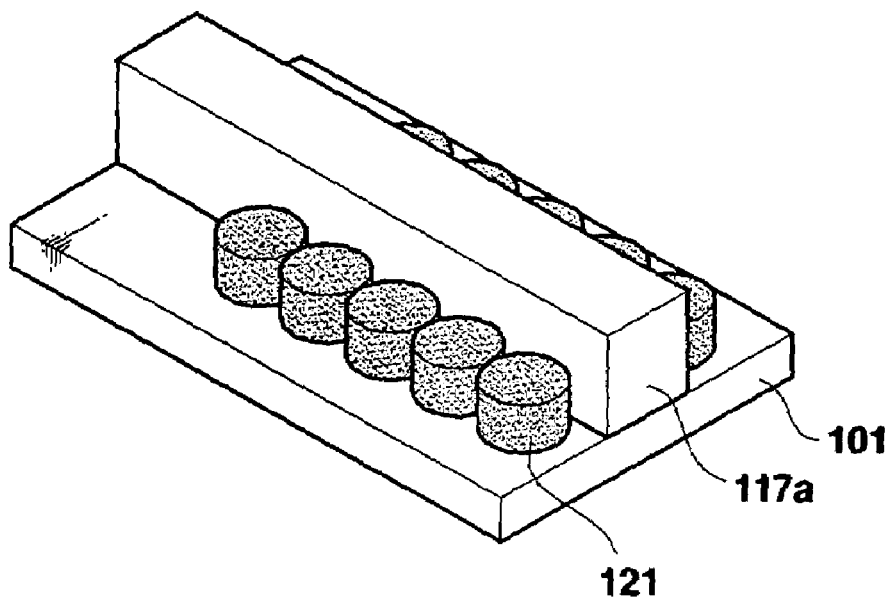

Referring to FIGS. 12 and 13, a respective epitaxy structure 121 is formed at each exposed end of the active patterns 102a from selective epitaxial growth (step S3 of FIG. 5). In such a process, a semiconductor material such as silicon grows from exposed portions of the active patterns 102a also comprised of a semiconductor material.

In one embodiment of the present invention, the thickness of the epitaxy structures 121 is controlled such that the epitaxy structures 121 grown from two adjacent active patterns 102a contact each-other. Accordingly, a target thickness of the epitaxy structures 121 is determined by a pitch of the active patterns 102a, such as greater than half of the space between the adjacent active patterns 102a.

The epitaxy structures 121 are formed using low-pressure CVD (LPCVD) or ultra-high vacuum CVD (UHV-CVD), in an example embodiment of the present invention. The epitaxy structures 121 comprised of silicon for example are formed from a LPCVD process with a mixture of $SiH_2Cl_2$ gas and HCl gas at a deposition pressure of about 10-30 torr and a deposition temperature of about 850° C. or from an UHV-CVD process with $Si_2H_6$ gas at a deposition pressure of about $10^{-4}$-$10^{-5}$ torr and a deposition temperature of about 600-700° C.

The epitaxy structures 121 comprised of silicon-germanium for example are formed from a LPCVD process with a mixture of $SiH_2Cl_2$ gas, HCl gas, and $GeH_4$ gas at a deposition pressure of about 20 torr and a deposition temperature of about 650-750° C. or from an UHV-CVD process with a mixture of $SiH_2Cl_2$ gas, HCl gas, and $GeH_4$ gas at a deposition pressure of about $10^{-4}$-$10^{-5}$ torr and a deposition temperature of about 550-600° C.

During such selective epitaxial growth, the epitaxy structures 121 may be doped in situ with a dopant such as boron, phosphorus, arsenic, indium, or antimony, and the dopant concentration may be adjusted during the epitaxial growth. With such epitaxial growth, the epitaxy structures 121 are formed with desired dopant concentration, lower defect density than bulk silicon, and desired size and thickness.

Figure 14:
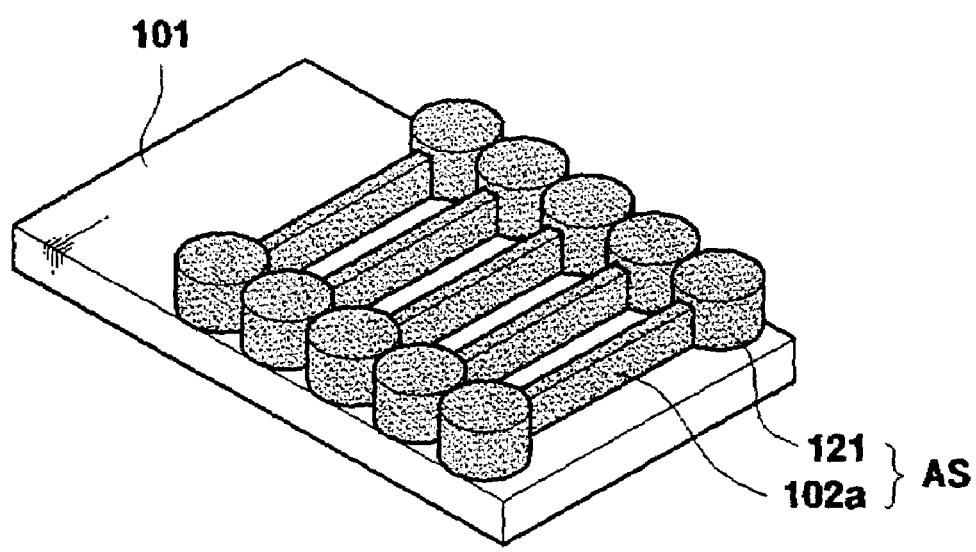

Referring to FIGS. 13 and 14, the epitaxial mask 117a and the etch stopper 115 under the epitaxial mask 117a are removed (step S4 of FIG. 5). Thus, an active structure AS results in FIG. 14 with a center portion of each of the active patterns 102a having uniform critical dimension.

Figure 15:
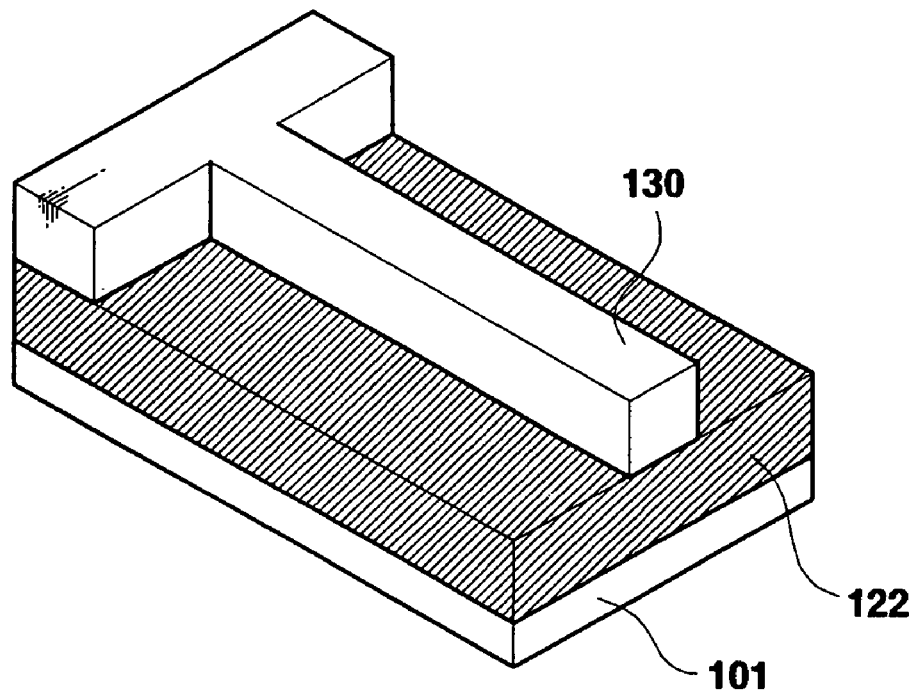

Thereafter, a tri-gate transistor is formed with the active structure AS as will be described with reference to FIGS. 15, 16, and 17. Referring to FIG. 14, ion implantation is performed on the active structure AS for adjusting a threshold voltage of the tri-gate transistor. Thereafter in FIG. 15, a gate insulating layer (not shown) and a gate electrode conducting layer 122 are sequentially blanket-deposited on the active structure AS.

The gate insulating layer is comprised of one of an oxide, a thermally grown silicon dioxide, silk, polyimide, or a high k dielectric material, for example. The oxide for the gate insulating layer may be formed from dry oxidation with $O_2$ gas at a temperature of 1000-1100° C., from wet oxidation with an atmosphere of water vapor at a temperature of 1000-1100° C., HCl oxidation using $O_2$ gas and HCl gas, oxidation using $O_2$ gas and $C_2H_3Cl_3$ gas, oxidation using $O_2$ gas and $C_2H_2Cl_2$ gas, or the like. The high k dielectric material for the gate insulating layer is comprised of $Al_2O_3$, $Ta_2O_5$, $HfO_2$, $ZrO_2$, hafnium silicate, zirconium silicate, or a combination thereof, for example from atomic layer deposition.

The gate electrode conducting layer 122 is comprised of doped polysilicon, metal, metal silicide, or a stack of such materials. Examples of such metal include tungsten, cobalt, or nickel. Examples of such metal silicide include tungsten silicide, cobalt silicide, and nickel silicide. The doped polysilicon is formed by LPCVD using $SiH_2Cl_2$ and $PH_3$ gas. The gate electrode conducting layer 122 is conformally formed over the active structure AS.

Subsequently in FIG. 15, a photoresist pattern 130 is formed from the gate pattern GP of FIG. 6. Referring to FIGS. 15 and 16, exposed portions of the gate electrode conducting layer 122 are etched away using the photoresist pattern 130 as an etch mask to form a gate electrode 122a (step S5 of FIG. 5). Thereafter, the photoresist pattern 130 is removed. In addition, note that a gate insulator (not shown) is also disposed under the gate electrode 122a from the portion of the gate insulating layer remaining under the gate electrode 122a (step S5 of FIG. 5).

Figure 16:
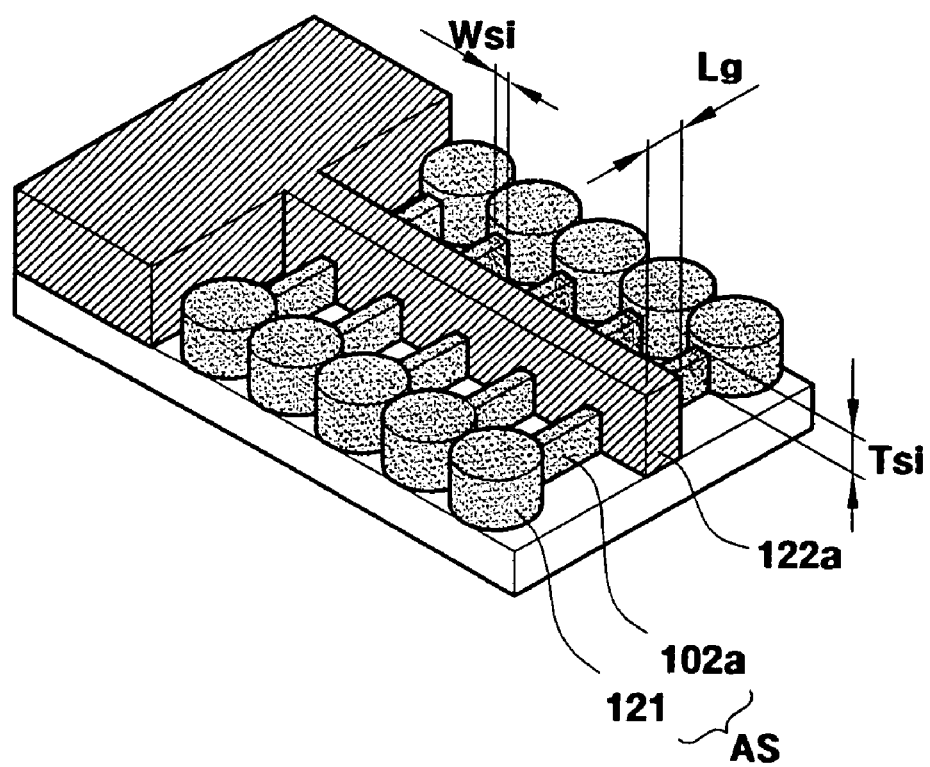
Figure 17:
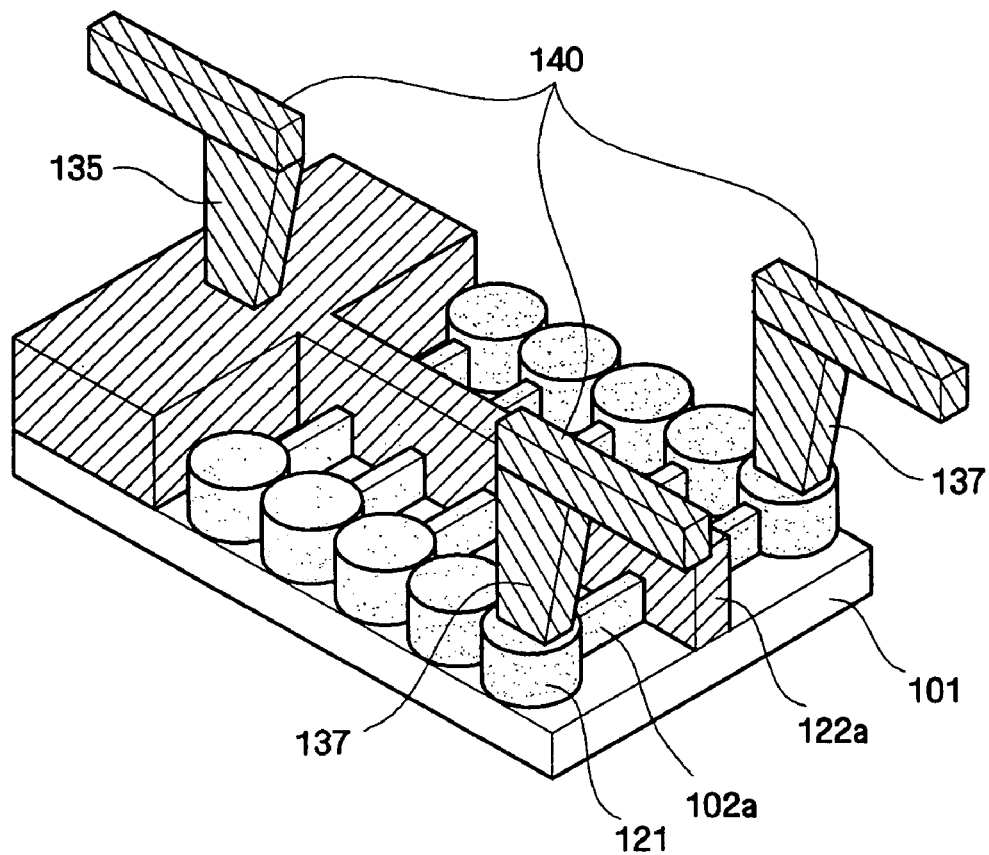

Further referring to FIG. 16, the gate electrode 122a is formed over a center portion of each of the active patterns 102a. In addition, the gate electrode 122a is formed over three surfaces of each active pattern 102a including opposite sides and a top surface of the active pattern 102a. The area of overlap of the gate electrode 122a over each active pattern has a thickness Tsi, a width Wsi, and a gate length Lg in FIG. 16. Such area of overlap forms the channel region from the three surfaces of each active pattern 102a to form the tri-gate transistor of the present invention.

Further referring to FIG. 16, a source and a drain are formed from the epitaxy structures 121 (step S6 of FIG. 5). For example, a first set of the epitaxy structures 121 that contact each-other along one side of the gate electrode 122a are used for forming a source of the tri-gate transistor. In that case, a second set of the epitaxy structures 121 that contact each-other along the opposite side of the gate electrode 122a are used for forming a drain of the tri-gate transistor. In addition, an ion implantation process is performed for implanting a dopant into exposed portions of the active structure AS in FIG. 16 for doping such source and drain.

The tri-gate transistor is comprised of such drain and source and the channel region formed from the active structure AS. Thereafter, referring to FIG. 17, an interlayer insulating layer (not shown) is formed. Subsequently, contact plugs 137 are formed for contacting the source/drain. In addition, a contact plug 135 is formed for contacting the gate electrode 122a. Moreover, upper interconnect wirings 140 are formed for connection from the contact plugs 135 and 137.

In this manner, the center portion of the active patterns 102a having the channel region formed thereon has uniform critical dimension for enhanced performance of the tri-gate field effect transistor. In addition, the epitaxy structures 121 are used to form the source and drain with low defect density and controlled dopant concentration for high quality contact of the contact plugs 137 thereon.

Such a multi-gate transistor is advantageously used in highly integrated semiconductor memory devices such as a dynamic random access memory (DRAM) device, a static RAM (SRAM) device, a flash memory device, a ferroelectric RAM (FRAM) device, a magnetic RAM (MRAM) device, and a parameter RAM (PRAM) device, micro electro mechanical system (MEMS) devices, optoelectronic devices, display devices, and processors such as a central processing unit (CPU) and a digital signal processor (DSP). In particular, such a multi-gate transistor is advantageous within a logic device or an SRAM device operating at high speed.

Figure 18:
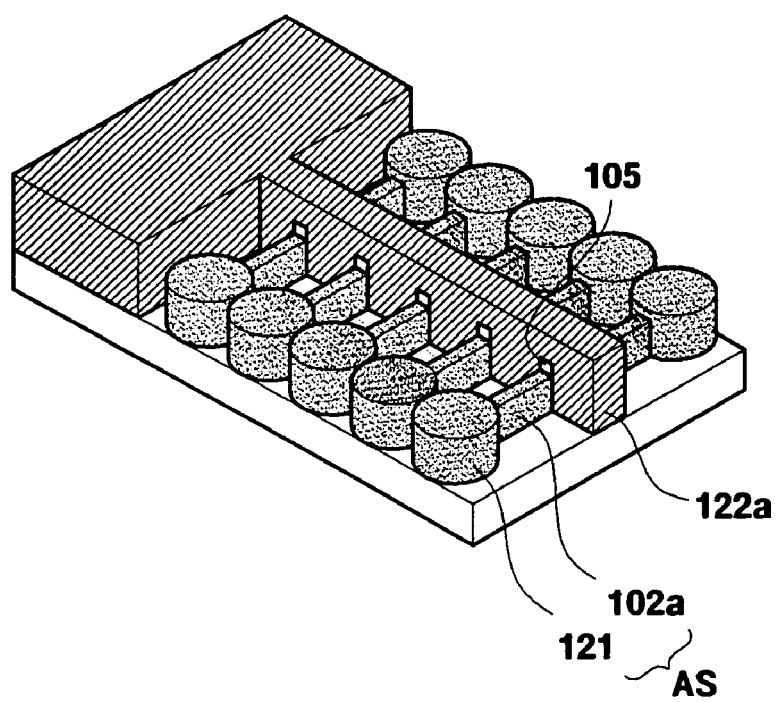
FIG. 18 shows a perspective view of a multi-gate transistor having a double-gate transistor, according to another embodiment of the present invention.

FIG. 18 shows a perspective view for fabricating a double-gate transistor according to another embodiment of the present invention. The steps for fabricating the double-gate transistor of FIG. 18 are similar to those described for fabricating the tri-gate transistor of FIG. 16. However, in the double-gate transistor of FIG. 18, channel regions are formed just on the opposite sides of the active pattern 102a. Accordingly, an insulating cap 105 is formed on the top surface of each of the active patterns 102a before formation of the gate electrode 122a.

Figure 19:
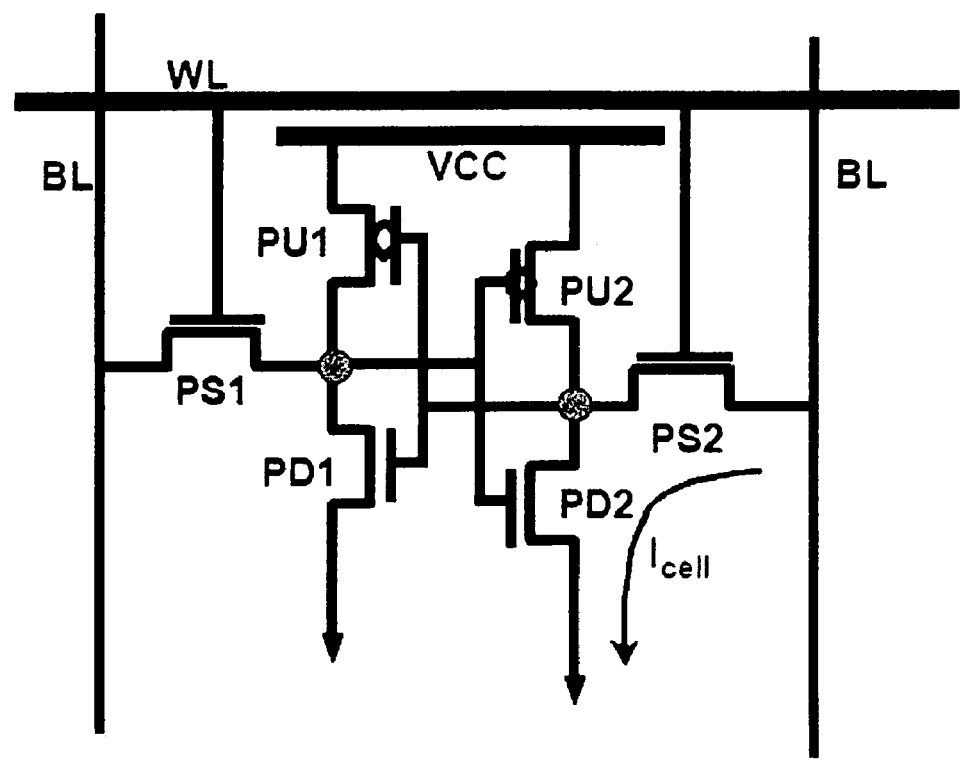
FIG. 19 shows a circuit diagram of a static random access memory (SRAM) cell having multi-gate transistors formed according to an embodiment of the present invention.

FIGS. 19, 20, 21, 22, 23, and 24 illustrate fabrication of tri-gate transistors for a SRAM cell according to another embodiment of the present invention. FIG. 19 shows a circuit diagram of a SRAM cell, FIGS. 20A, 20B and 20C are layout diagrams of an active pattern AP, an epitaxial mask pattern EM, and a gate pattern GP, respectively. The active pattern AP of FIG. 20A, the epitaxial mask pattern EM of FIG. 20B, and the gate pattern GP of FIG. 20C each include optical proximity corrections. FIGS. 21, 22, 23, and 24 are perspective views of structures formed during fabrication of the tri-gate transistor for the SRAM cell.

Referring to FIG. 19, a CMOS SRAM cell includes two pull-up transistors PU1 and PU2, two pull-down transistors PD1 and PD2, and two pass (or access) transistors PS1 and PS2. In FIG. 19, WL denotes a word line, BL denotes a bit line, and Vcc denotes a power supply voltage line.

Fabrication of the tri-gate transistors for the SRAM cell of FIG. 19 is now described with reference to FIGS. 20A, 20B, 20C, 21, 22, 23, and 24. Descriptions apparent from the above description in reference to FIGS. 7-17 are omitted.

Figure 20A:
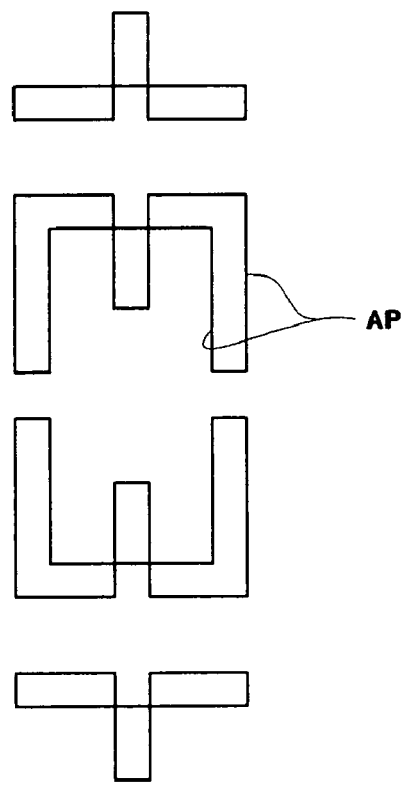
FIGS. 20A, 20B, and 20C show layouts of an active pattern, an epitaxial mask pattern, and a gate pattern, respectively, for fabricating the SRAM cell of FIG. 19, according to an embodiment of the present invention.
Figure 21:
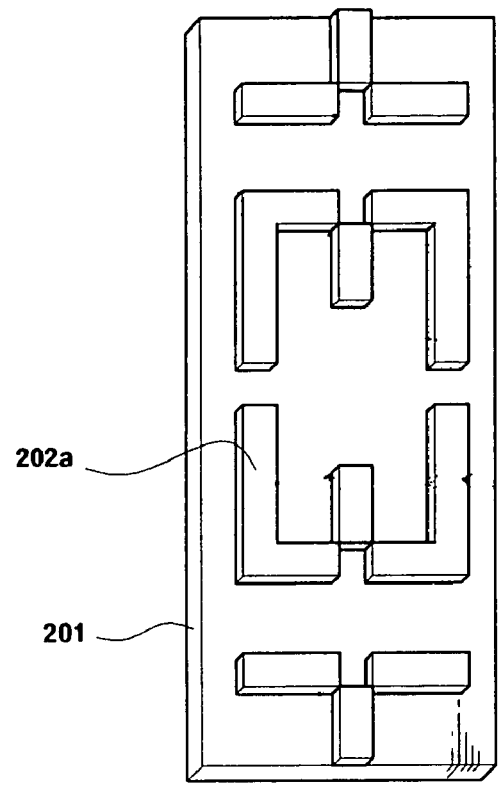
FIGS. 21, 22, 23, and 24 show perspective views of structures formed during fabrication of the SRAM cell of FIG. 19, according to an embodiment of the present invention.

Referring to FIGS. 20A and 21, photolithography and etching are performed on a semiconductor layer comprised of silicon for example to form an active pattern 202a on an insulating layer 201. The active pattern 202a of FIG. 21 is formed from transfer of the active pattern AP of FIG. 20A.

Figure 20B:
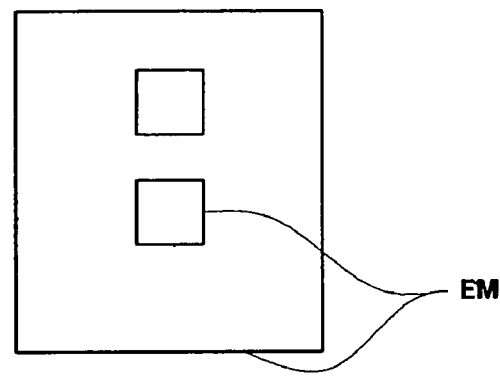
Figure 20B:
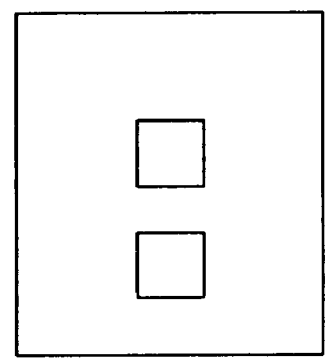
Figure 22:
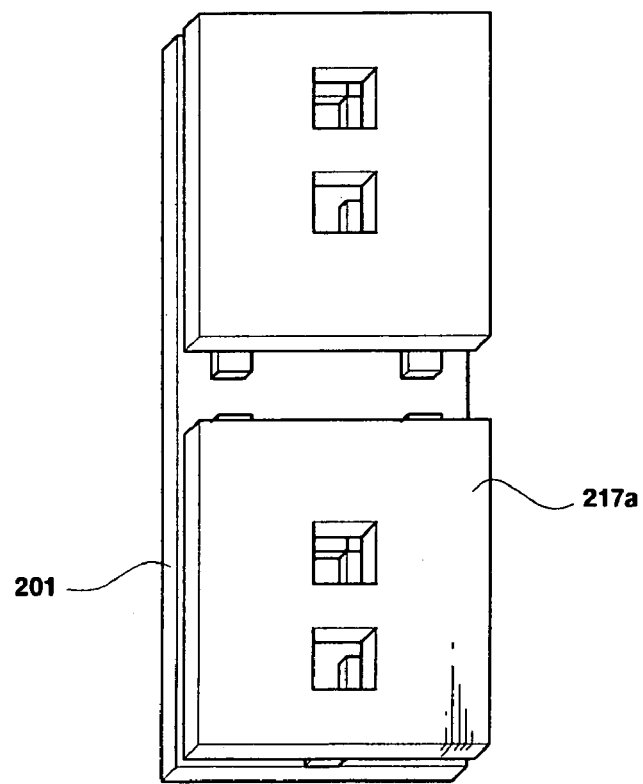

Referring to FIGS. 20B and 22, an epitaxial mask layer is blanket-deposited after FIG. 21. In addition, photolithography and etching are performed with the epitaxial mask layer to form an epitaxial mask 217a from transfer of the epitaxial mask pattern EM of FIG. 20B.

Figure 23:
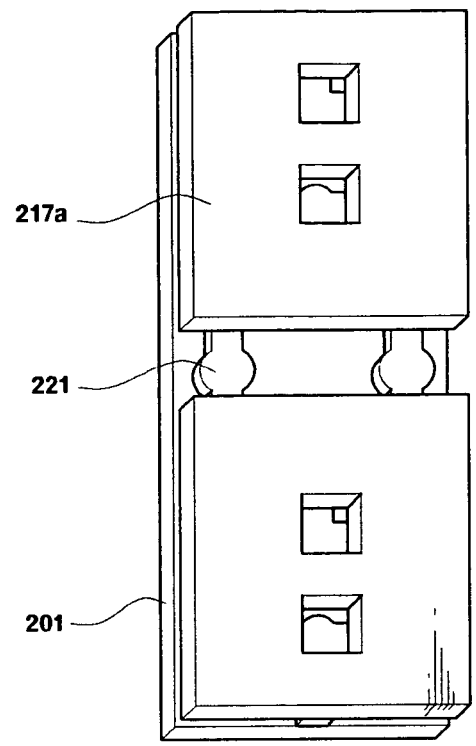

Referring to FIG. 23, epitaxy structures 221 are grown from portions of the active pattern 202a exposed from the epitaxial mask 217a in a selective epitaxial process. A source/drain is formed with each of the epitaxy structures 221. The size and thickness of the epitaxy structures 221 can be easily adjusted by controlling the epitaxial process. Thus, contact for such epitaxy structures 221 is ensured despite optical proximity effects.

Figure 20C:
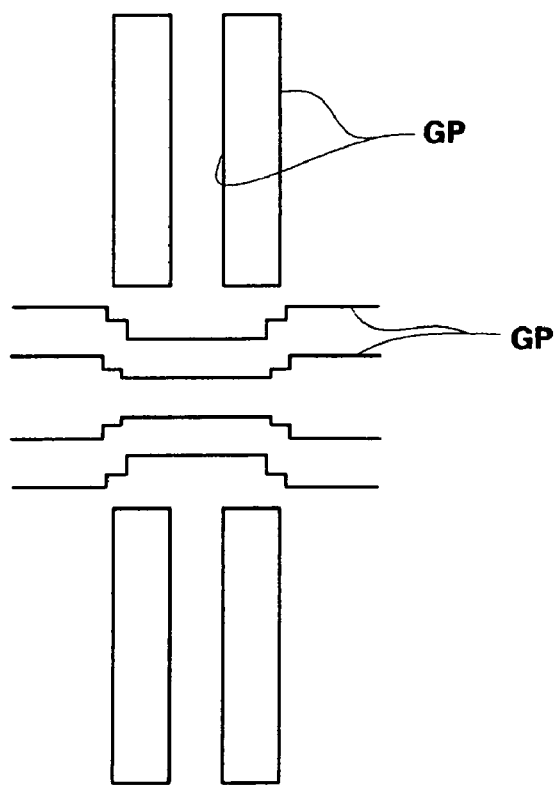
Figure 24:
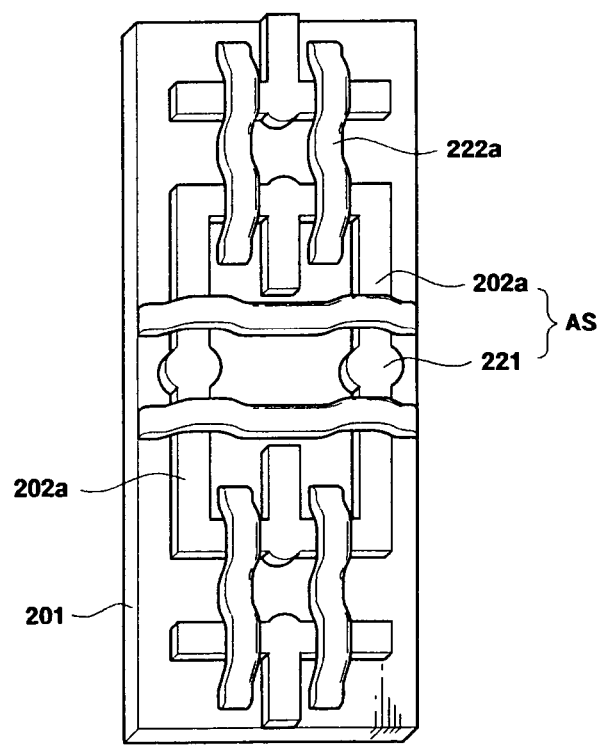

Referring to FIG. 24, the epitaxial mask 217a is removed, and gate electrodes 222a are formed from transfer of the gate pattern GP of FIG. 20C. Each gate electrode 222a is conformally formed to overlap opposite sides and a top surface of a respective active pattern 202a to form a tri-gate transistor. In addition, six gate electrodes 222a are formed in FIG. 24 for the six field effect transistors PU1, PU2, PD1, PD2, PS1, and PS2 for the SRAM cell of FIG. 19.

While the present invention has been particularly shown and described through exemplary embodiments thereof with reference to the accompanying drawings, it will be understood by those of ordinary skill in the art that various changes in form and details may be made therein without departing from the spirit and scope of the present invention as defined by the following claims.

Thus, the foregoing is by way of example only and is not intended to be limiting. For example, any materials and parameters values described herein are by way of example only. In addition, any shapes of structures illustrated and described herein are by way of example only. Furthermore, the multi-gate field effect transistors are illustrated and shown to be formed for a SRAM cell. However, the multi-gate field effect transistor of the present invention may be used for any other type of integrated circuit using a field effect transistor.

The present invention is limited only as defined in the following claims and equivalents thereof.

What is claimed is:

1. A method of fabricating a multi-gate transistor, comprising:
    A. forming a plurality of active patterns;
    B. forming an epitaxial mask over a center portion of the active patterns;
    C. growing epitaxially a respective epitaxy structure from a respective exposed portion of each of the active patterns, after the step B;
    wherein the respective epitaxy structures of the active patterns are epitaxially grown in said step C to contact each-other;
    D. removing the epitaxial mask after the step C; and
    E. forming a gate electrode to form a channel region from at least two surfaces of the active patterns after the step D.

2. The method of claim 1, further comprising:
    forming the channel region from surfaces of at least two of the active patterns.

3. The method of claim 2, further comprising:
    forming a gate insulator and the gate electrode along center portions of the active patterns.

4. The method of claim 3, further comprising:
    forming an insulating cap on top of each active pattern before forming the gate insulator and the gate electrode for forming the channel region at two surfaces of each active pattern.

5. The method of claim 1, further comprising:
    forming a drain from a first set of epitaxy structures that contact each other; and
    forming a source from a second set of epitaxy structures that contact each other.

6. The method of claim 1, further comprising:
    forming a semiconductor layer on an insulating layer; and
    patterning the semiconductor layer to form the active patterns.

7. A method of fabricating a multi-gate transistor, comprising:
    A. forming at least one active pattern;
    B. growing epitaxially at least one epitaxy structure from an exposed portion of the active pattern, after the step A; and
    C. forming a gate electrode over a center portion of the active pattern to form a channel region from at least two surfaces of the active pattern, wherein the gate electrode is formed after the step B of forming the epitaxy structure.

8. The method of claim 7, further comprising:
    forming a plurality of active patterns each being a line pattern having a mesa shape; and
    growing a respective epitaxy structure from each end of the active patterns.

9. The method of claim 8, further comprising:
    forming the channel region from surfaces of at least two of the active patterns.

10. The method of claim 9, further comprising:
    forming a gate insulator and the gate electrode along center portions of the active patterns.

11. The method of claim 10, further comprising:
    forming an insulating cap on top of each active pattern before forming the gate insulator and the gate electrode for forming the channel region at two surfaces of each active pattern.

12. The method of claim 8, further comprising:
    forming at least two of the epitaxy structures to contact each-other.

13. The method of claim 12, further comprising:
    forming a drain from a first set of epitaxy structures that contact each other; and
    forming a source from a second set of epitaxy structures that contact each other.

14. The method of claim 7, further comprising:
    forming a semiconductor layer on an insulating layer; and
    patterning the semiconductor layer to form the active pattern.

15. The method of claim 7, further comprising:
    forming an epitaxial mask on a portion of the active pattern on which the channel region is to be formed before growing the epitaxy structure from the exposed portion of the active pattern; and
    removing the epitaxial mask before forming the gate electrode.

16. The method of claim 7, further comprising:
    forming two epitaxy structures, each from a respective end of the active pattern that is a line pattern; and
    forming each of a drain and a source with a respective one of the epitaxy structures.

* * * * *